Figure 1:
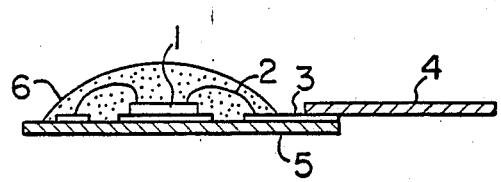
Figure 2:
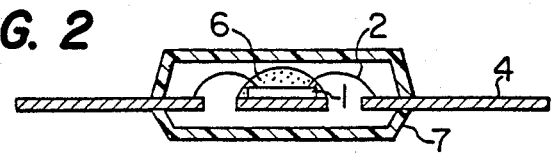

United States Patent [19]

Segawa et al.

[11] Patent Number: 4,933,744
[45] Date of Patent: Jun. 12, 1990

[54] RESIN ENCAPSULATED ELECTRONIC DEVICES

[75] Inventors: Tadanori Segawa; Hiroshi Suzuki; Masahiro Kitamura; Shunichi Numata, all of Hitachi; Kunihiko Nishi, Higashikurume, all of Japan

[73] Assignee: Hitachi, Ltd., Tokyo, Japan

[21] Appl. No.: 150,502

[22] Filed: Feb. 1, 1988

Related U.S. Application Data

[63] Continuation of Ser. No. 636,297, Jul. 31, 1984, abandoned, which is a continuation of Ser. No. 304,610, Sep. 22, 1981, abandoned.

[30] Foreign Application Priority Data

Sep. 22, 1980 [JP] Japan .............................. 55-130682

[51] Int. Cl.$^5$ ...................... H01L 23/28; H01L 23/30
[52] U.S. Cl. .................................. 357/72; 357/73; 174/52.2
[58] Field of Search .................... 357/72, 73; 174/52.2

[56] References Cited

U.S. PATENT DOCUMENTS

| 4,001,655 | 1/1977 | Voyles et al. ........................ 357/72 |
| 4,024,570 | 5/1977 | Hartmann et al. ..................... 357/72 |
| 4,042,955 | 8/1977 | Imai et al. .......................... 357/72 |
| 4,047,075 | 9/1977 | Schoberl ............................ 357/72 |
| 4,092,487 | 5/1978 | Imai ................................ 357/72 |
| 4,220,962 | 9/1980 | Sommer et al. ....................... 357/72 |
| 4,327,369 | 4/1982 | Kaplan .............................. 357/72 |
| 4,529,755 | 7/1985 | Nishikawa et al. ................. 174/52.2 |

FOREIGN PATENT DOCUMENTS

| 50-6279 | 1/1975 | Japan ............................... 357/72 |
| 50-6280 | 1/1975 | Japan ............................... 357/72 |

OTHER PUBLICATIONS

E. H. Rowe et al., "Toughening Thermosets with Liquid Butadiene/Acrylonitrile Polymers", *Modern Plastics*, Aug. 1970, pp. 110–117.

Primary Examiner—J. Carroll
Attorney, Agent, or Firm—Antonelli, Terry, Stout & Kraus

[57] ABSTRACT

Resin encapsulated electronic devices are provided by encapsulating so-called flat-shaped, plate-like, or angular-shaped electronic devices with a resin composition containing rubber-like particles preferably having an average particle size of 150 μm or less. In the course of production of said resin encapsulated electronic devices, no crack is produced in the electronic devices by the stress from the outside, and after production, said resin encapsulated electronic devices are amazingly lessened in formation of cracks by thermal stress and have high reliability.

30 Claims, 3 Drawing Sheets

FIG. 3b

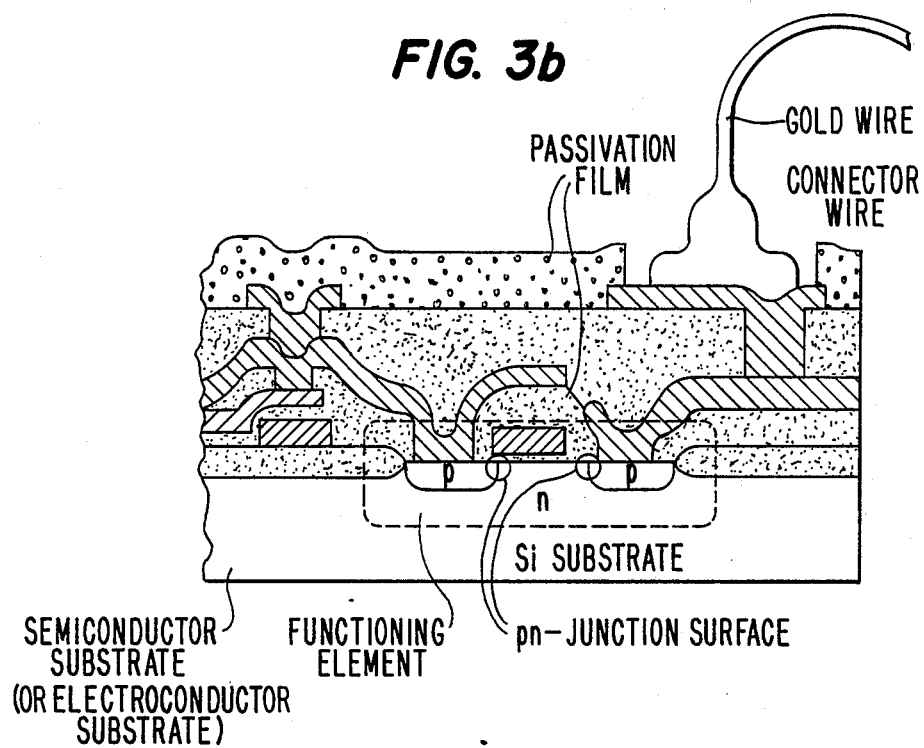

RESIN ENCAPSULATED ELECTRONIC DEVICES

This application is a continuation of application Ser. No. 636,297, filed Jul. 31, 1984, abandoned, which is a continuation of application Ser. No. 304,610 filed Sept. 22, 1981, abandoned.

This invention relates to resin encapsulated electronic devices including, for example, semiconductor devices such as diodes, trannsistors, IC, LSI, etc., and other electronic devices including resistors, capacitors, etc., and more particularly the invention relates to improved resin encapsulated electronic devices.

In recent years, resin encapsulated electronic devices have become predominant in the market of electronic devices such as mentioned above, and the demand for such resin encapsulate electronic devices keeps on increasing. However, these electronic devices are vulnerable to the stress produced during molding or from the outside, and they may break (develop cracks) even by a stress produced when the encapsulating resin is cured. Such a tendency is increased in case the stress concentrates at corners, typically in the electronic devices, such as semiconductor elements, which are pre se fragile to stress and also have a plate-like configuration or have angular portions.

Encapsulation of electric devices with resin has been known in the art and actually employed on many parts. For instance, ioncorporation of rubber-like particles in a hard matrix for improving impact strength or thermal shock characteristics is proposed in a report by E. H. Rowe et al (Modern Plastics, 47, 110 (1970)). And when electric parts are molded by using these resins (probably the dispersed hard matrix particles are covered with rubber), it is difficult to bring about cracks in the resin as disclosed in Japanese Patent Appln Kokai (Laid-Open) No. 81360/79. However, in general electronic devices are poorly resistant to stress and may suffer cracks. Such a device may be out of commission even by the presence of a stress produced from curing shrinkage of resin as noted above, so that the encapsulating resin of the type employed for the electric devices strongly resistant to stress, such as motor or washer, can not be immediately applied to the electtronic devices.

On the other hand, efforts are being made for achieving higher density and greater scale of elements for enhancing the integration capacity of semiconductor devices such as IC and LSI while, conversely, there is seen an increasing tendency toward miniaturization of the package. However, in the case of electronic devices comprising large-sized elements encapsulated with a conventional resin, cracks tend to develop in the element surface. This tendency is boosted if the package is thinned, and finally cracks are formed even in the encapsulation resin layer. Similar trend toward larger size of the semiconductor elements is seen in such electronic devices as transistors and thyristors with improvement of high voltage resistance, and the same problem of cracks is encountered in these devices, too. Thus, the conventional electronic devices having large-sized elements encapsulated with resin had a problem of poor reliability.

In order to throw light on the causes of cracking in the electronic devices such as the elements or in the encapsulating resins, the preset inventors have conducted analyses of stress in these elements and resins and, as a result, found that the greater the so-called flatness of the element (or the thinner the plate-like element) becomes and also the smaller the size of the package, the greater is the stress produced at the ends of the element, and that the thermal stress which adversely affects the element can be reduced by dispersing specific rubber-like particles in the encapsulating resin layer, and these findings have led to the achievement of the present invention.

Thus, the present invention is designed to eliminate the problems of the prior art and prevent development of cracks in the electronic devices such as the elements of electronic devices so as to provide high-reliability resin encapsulated electronic devices.

More specifically, the present invention provides a resin encapsulated electronic device comprising an electrtonic device having necessary functioning elements at least one of which is fragile on its major surface and a cured resin composition containing the rubber-like particles therein and encapsulating said electronic device.

Figure 11:
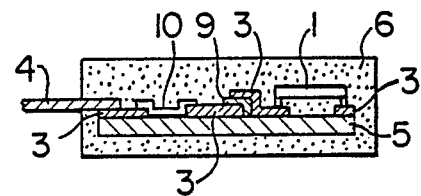

Referring to the accompanying drawings, FIGS. 14 to 11 are sectional views showing the embodiments of the present invention.

The electronic devices to be resin encapsulated according to this invention have at least one major surface whose area is much larger than that of side surface thereof, in other words, have a so-called flat or plate-like configuration, and in some cases together with an angular or corner portion. If an electronic device, for example an element (hereinafter discussion is made on the elements as typical exemplification of electronic devices) is not flat or plate-like in configuration, cracking of the element poses no serious problem. The so-called flat configuration which presents the problem to be considered is of a flatness such that the maximium lateral length is four times or more larger than the vertical thickness, and in such case, the effect of this invention becomes remarkable. This is because the stress is localized when the element configuration is so-called flat or plate-like. Particularly when the shape of the element is, for example, square or rectangular, the stress is concentrated at the corners and hence the effect of the resin composition used in this invention becomes conspicuous. However, if the element after resin encapsulation has a so-called flat cross-sectional configuration parallel to the side surface, the major surface may be circular, oval or polygonal.

The electronic devices to be resin encapsulated according to this invention also include resistors, capacitors and the like. Typically, they are the semi-conductor elements such as diodes, transistors, IC (integrated circuits) and LSI (large-scale integrated circuits). Particularly when such elements measure, for example, about 0.5 mm in thickness and more than 2 mm in the maximum length, that is, when the maximum lateral length is four times or more as large as the thickness, the effect of this invention is most appreciated. If the maximum length of the element is less than 2 mm, cracking of the element presents no specific problem but on the other hand such element proves incapable of enhancing the integration capacity of IC or LSI or meeting the requirement for high voltage resistance of transistors or thyristors. The "maximum length" of the element means the diameter when the major surface (so-called flat plane) of the element is circular, the longer diameter when the major surface (so-called flat plane) of the element is oval, the length of the longest diagonal when the major surface (so-called flat plane) of the element is polygonal, and one side of the longest length when the major surface (so-called flat plane) of the element is square or rectangular.

According to this invention, said elements are encapsulated with a resin composition containing specific rubber-like particles. The encapsulating resin may be essentially either thermoplastic resin or thermosetting resin, but practically, a thermosetting resin is preferably used because of lowr melting viscosity and higher workability. Examples of the thermosetting resins usable in this invention are epoxy resins, unsaturated polyester resins, addition type imide resins, urea resins, melamine resins, urethane resins, phenolic resins, epoxy isocyanate resins, cyanate resins, phenol-aromatic hydrocarbon-formaldehyde resins, cyanate-polymaleimide resins, diallyl phthalate resins, triallyl isocyanate resins, and silicone resins. These resins may be used either singly or in combination. Among these resins, epoxy resins, phenolic resins, addition type imide resins, urethane resins, epoxy-isocyanate resins and diallyl phthalate resins are more preferable.

The "rubber-like particles" are ones which show an elastic modulus of 30 kg/mm$^2$ or less (at room temperature), preferably 3 kg/mm$^2$ or less. Preferred examples of the materials giving said rubber-like particles showing an elastic modulus within said range are the polybutadiene- or butadiene-based copolymers such as butadiene-acrylonitrile copolymer and butadiene-styrene copolymer, isoprene rubber, chloroprene rubber, natural rubber, polyurethane rubber, ethylene-propylene ruubber, silicone rubber, fluorine rubber, fluorosilicone rubber, polyester rubber and polyphosphazene rubber (an inorganic elastomeer having phosphorus and nitrogen on main chain). These may be used singly or in admixture.

These rubbers are preferably of the type which melts during molding and forms the rubber-like particles after molding and which also has one or more functional groups reactive with the matrix resin. As examples of such functional groups, there may be cited a carboxyl group, an epoxy group, a hydroxyl group, an isocyanate group, an amino group and a vinyl group. As for the form in which said rubber material is used, there may be selected any suitable form such as finely particulate powder, aqueous latex, uncured liquid, etc., provided that, as the final form after molding, such material stays dispersed as rubber-like particles in the resin composition.

The size of the rubber-like particles is less than 1,000 μm, preferably 150 μm or less on the average, more preferably 30 μm or less on the average. If the size of the rubber-like particles is greater than 150 μm, there is a tendencyy that the rubber-like particle distribution in the resin composition may become non-uniform during molding, making difficult the flow of the resin composition containing such rubber-like particles in narrow portions during the resin encapsulation operation. The rubber-like particle content in the resin composition of this invention is preferably not higher than 70% by volume in case a finely particulate rubber is used as rubber material. If the rubber-like particle content is over 70% by volume, the resin composition becomes hard to flow in the narrow portions during the resin encapsulation operation. In case of using an aqueous latex, or uncured liquid rubber and curing it simultaneously with the matrix resin, the rubber-like particle content in the resin composition is preferably 50% by volume or less, because if the rubber-like particle content exceeds 50% by volume, the rubber phase in the resin composition becomes to be continuous unfavorably. In the resin composition of this invention, practically the rubber-like particle content of less than 30% by volume suffices for the object of the invention, and a satisfactory effect is obtained even when said content is over about 1% by volume, for example, 1.5% by volume.

If desired, there may be contained in the resin composition of this invention a suitable inorganic filler such as quartz glass powder, preferably in an amount not greater than 80% by volume, more preferably not greater than 65% by volume, for further improving crack resistance of the encapsulating resin. The filler used here is of a size preferably not greater than 200 μm, more preferably not greater than 100 μm. If the filler size is greater than 200 μm, gold wires connecting the lead frame of the semiconductor device and the elements may be bent so greatly as to even cause breaking of the wire. This holds true when the rubber particles stay as solid masses of large sizes during the molding operation. This, however, is of no serious problem because usually the rubber particles are formed in the course of curing.

In the present invention, dispersion of the specific rubber-like particles in the encapsulating resin composition is considered conductive to the reduced elastic modulus of the resin composition, which minimizes the stress to the elements in the resin composition to inhibit cracking of the elements. However, as seen from the Examples given later, the results of the various reliability tests conducted on the actually fabricated resin encapsulated semiconductor devices and sample stress measurements showed that there is actually provided a far greater stress reducing effect than the stress reducing rate calculated from the reduction of the elastic modulus by the rubber/like particles dispersed in the resin composition. This is considered ascribable to the following phenomenon: the stress relaxation rate of the hard phase around the rubber-like particles is elevated by the presence of the rubber-like particles, or the stress is released as a result of interfacial separation of the hard phase around the rubber-like particles.

As described above, the present invention can minimize the stress given by the encapsulating resin and is therefore advantageously applicable to the electronic devices in which the stress is localized due to a so-called flat or plate-like configuration of the elements and which have poor mechanical strength. Examples of such electronic devices are the large-size IC or LSI in which the maximum length of the elements is over 2 mm, or the electronic devices manufactured by using the ceramic substrate thick-film techniques. Particularly in power IC (high voltage resistant IC) or an electronic device made by using the ceramic substrate thick-film techniques, in case one side alone of the element is encapsulated with the resin composition of this invention for enhancing the heat dissipation efficiency, it is possible to prevent warp of the heat radiating plates and ceramic substrate by dint of said encapsulating resin and to also prevent break of the element due to such warp. Further, in the case of a device which includes, for example, ferrite core where the magnetic force may be varied by the stress, application of the resin encapsulation according to this invention can diminish the stress to prevent otherwise possible change of magnetic force in the ferrite core. The present invention also finds a very effective application to the devices wherein the form after encapsulated with the resin has a so-called flat or plate-like configuration as seen such as LSI, where the elements are most likely to suffer damage by stress.

A resin encapsulated semiconductor device is illustrated in FIGS. 1 to 11 of the accompanying drawings as a typical example of the resin encapsulated electronic devices containing the so-called flat or plate-like-shaped elements.

In the drawings, reference numeral 1 designates a flat-shaped semiconductor element having a p-n junction and made of silicon, germanium or the like material, such as an IC, LSI, transistor or thyristor, said element measuring 0.1–1 mm in thickness and 2 mm or more in length of one side. Numeral 2 indicates an internal fine connector wire connecting the semiconductor element 1 and the outer lead 4, said wire being made of Au, Al or the like material. Numeral 3 is a metallic conductor which is a sort of internal connecting conductor fabricated by baking a Pd-Ag conductor on an $Al_2O_3$ insulating plate 5 with a vitreous material. The outer lead 4 may be formed from Cu or "Kovar" a registered trademark of Westinghouse Electric Corporation for a Fe-based alloy.

Numeral 4A and 4B each denotes a Cu foil which is a kind of conductor. In the case of the Cu foil 4B, it is formed on an insulating film 8 made of polyimide, polyester or the like materal or on the $Al_2O_3$ insulating plate 5. Instead of the $Al_2O_3$ insulating plate 5, there may be used a metallic sheet whose surface has been subjected to an oxidation treatment or resin coating. The Cu foil 4A is effective for heat dissipation. Also in the drawings, numeral 6 refers to a resin for encapsulating the semiconductor element 1, and in this invention, the rubber-like particles are dispersed in this encapsulating resin 6. As a modification, only the portion close to the semiconductor element 1 may be encapsulated with a resin having the rubber-like particles dispersed therein, with the portion indicated by 6A in the drawing being encapsulated with a different resin. It is of course possible to use the same resin composition for the portions indicated by 6 and 6A in the drawing. Numeral 7 denotes an insulator case made from epoxy resin, polyphenylene sulfide or other like material. 2A indicates metal balls or solder. FIG. 11 shows a sectional view of a hybrid IC, wherein numeral 9 refers to a capacitor and numeral 10 a resistor.

According to this invention, one of more preferable embodiments is a semiconductor device in which a semiconductor chip or Si wafer (usually 0.3 to 0.5 mm in thickness and 0.7 mm at most) is encapsulated directly or indirectly with a resin on capsulation (the thickness of package being usually 1.3 to 5 mm and 7 mm at most and the thickness of the resin on one side of the chip being 0.5 to 0.6 mm in usual) of a cured resin composition, said semiconductor chip having at least one major surface whose area is much larger than that of side surface thereof, said major surface being disposed with necessary functioning elements, the thickness of said capsulation in a direction perpendicular to said major surface of said semiconductor chip being preferably not greater than 24 times, more preferably 20 times or less, the thickness of said semiconductor chip, and said cured resin composition containing rubber-like particles dispersed therein. When the major surface has a passivation film such as glass passivation covering pn-junction surfaces, the glass passivation is so thin usually 1 to 2 $\mu$m and 3 $\mu$m at most that it is fragile. The effect of this invention can be admitted in such a case.

Figure 3A:
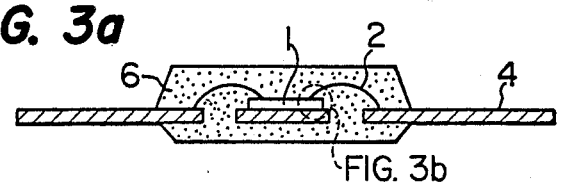
Figure 4:
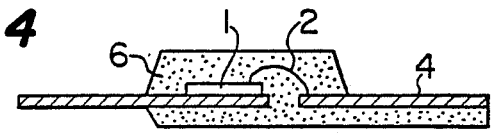
Figure 5:
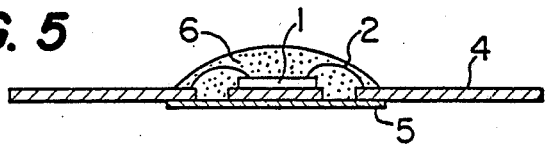
Figure 6:
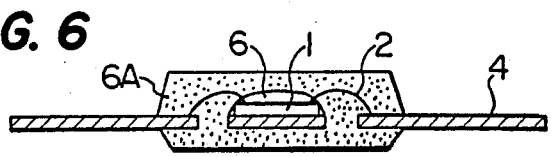
Figure 7:
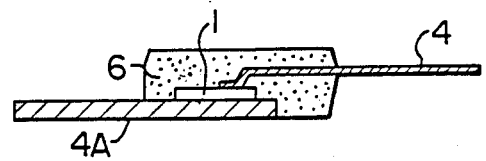
Figure 8:
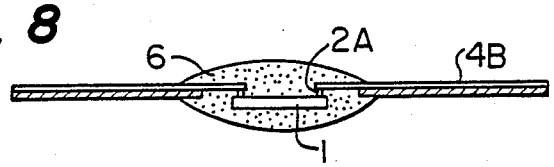
Figure 9:
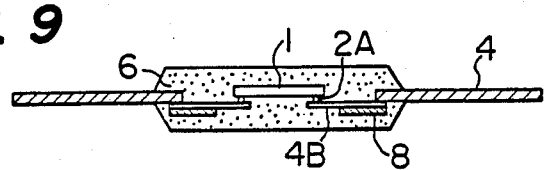
Figure 10:
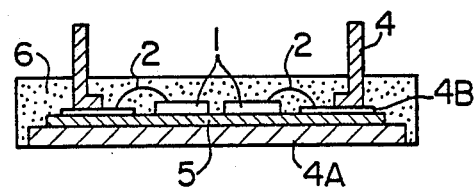

Further, a semiconductor device as shown in FIG. 3 or 4 is more preferable, said semiconductor device comprising outer leads (4), a semiconductor element having a p-n junction (1) formed on a portion of said lead (4), and at least one internal fine connector wire (2) which connects the semiconductor element (1) with the outer lead (4), at least connection portions between the semiconductor element (1) and the connector wire (2) and betweenn the connector wire (2) and the outer lead (4) being molded with an encapsulating resin (6).

According to this invention, cracks which are produced when the devices become thinner according to conventional techniques can be prevented and can satisfy the recent needs of the production of thinner devices. Previously, there had been no such need.

The present invention is described in further detail by way of the following Examples, in which all "parts" and "percents" are by weight unless otherwise noted.

EXAMPLE 1

The following ingredients (1)–(3) were stirred and mixed uniformly.

| (1) | $\alpha,\omega$-Dihydroxydimethylpolysiloxane (molecular weight: approx. 30,000) | 100 parts |
|---|---|---|
| (2) | Ethoxy silicate (molecular weight: approx. 700) | 2 parts |
| (3) | Dibutyltin dilaurate | 0.2 part |

Then 500 ml of water was added thereto, and the mixture was stirred and mixed by a homomixer at 15,000–20,000 r.p.m. for about 10 hours to obtain silicone rubber powder with a particle size of approximately 50–5 $\mu$m.

The following ingredients (4)–(9) were stirred and mixed uniformly.

| (4) | Said silicone rubber powder (20% by volume) | 74 parts |
|---|---|---|
| (5) | Bisphenol A type epoxy compound (epoxy equivalent: 192) | 100 parts |
| (6) | Vinylcyclohexenediepoxide (epoxy equivalent: 75) | 50 parts |
| (7) | Methyl-3,6-endomethylene-4-tetra-hydrophthalic anhydride (sold by Hitachi Chemical Co., Ltd., under the trade name MHAC-P) | 144 parts |
| (8) | 2-Ethyl-4-methylimidazole | 2 parts |
| (9) | $\gamma$-Glycidoxypropyltrimethoxysilane | 1 part |

The mixed solution was applied to the surface of a 5 mm×5 mm MOS type LSI silicone element having the structure shown in FIG. 1 to coat it to a maximum coating thickness of about 0.5 mm, that is, a thickness sufficient to conceal the connector wire, followed by curing at 100° C. for 2 hours and then at 150° C. for 5 hours to obtain a resin encapsulated semiconductor device having the silicone rubber particles dispersed in the encapsulating resin layer.

In order to examine the thermal shock resistance and hot water resistance of this resin encapsulated semiconductor devices, they were subjected to a composite acceleration test comprising repetition of a treating cycle of 1-hour immersion in 100° C. boiling water followed by 2-minute immersion in 0° C. ice water. As a result, no crack developed nor was seen any abnormality in said resin encapsulated semiconductor device even after 50 cycles of the composite acceleration test.

EXAMPLE 2

The following ingredients (1)–(4) were stirred and mixed by a homomixer at 500–10,000 r.p.m. while heating at 100° C. for 2 hours.

| | | |
|---|---|---|
| (1) | Addition type silicone resin (containing a curing agent KE-106LTV manufactured by Shin-Etsu Chemical Industry Co., Ltd.) (approx. 21% by volume) | 20 parts |
| (2) | Novolak type epoxy resin (epoxy equivalent: 175) | 100 parts |
| (3) | MHAC-P | 80 parts |
| (4) | Allylphenol | 1 part |

This composition was cooled to room temperature, then added with the following ingredients (5) and (6) and stirred and mixed uniformly. The rubber-like particles had a particle size ranging from 50 to 150 μm.

| | | |
|---|---|---|
| (5) | 2-Ethyl-4-methylimidazole | 1 part |
| (6) | γ-Glycidoxypropyltrimethoxysilane | 1 part |

The composition was then coated similarly to Example 1 on a 5 mm × 5 mm MOS type LSI silicone element of the structure shown in FIG. 1 and cured at 100° C. for 2 hours and at 150° C. for 5 hours to obtain a resin encapsulate semiconductor device having the silicone particles dispersed in the encapsulating resin layer.

When these devices were subjected to the same composite acceleration test as in Example 1, they stood 50 cycles of immersion test.

EXAMPLE 3

The following ingredientse (1)–(4) were heated to 100° C. and stirred for one hour.

| | | |
|---|---|---|
| (1) | Novolak type epoxy resin (epoxy equivalent: 175) | 100 parts |
| (2) | MHAC-P | 80 parts |
| (3) | Acrylnitrile-butadiene copolymer (rubber content 7% by volume) (sold by BF Goodrich under the trade name CTBN 1300 × 15) | 30 parts |
| (4) | Quartz glass powder (150 μm or less, 50% by volume) | 470 parts |

The mixture was cooled to room temperature, added with the following ingredients (5)–(6) and further stirred and mixed uniformly.

| | | |
|---|---|---|
| (5) | γ-Glycidoxypropyltrimethoxysilane | 3 parts |
| (6) | 2-Ethyl-4-methylimidazole | 1 part |

This composition was coated on a 5 mm × 5 mm MOS type LSI element in the same way as Example 1 and cured at 100° C. for 2 hours and at 150° C. for 5 hours to obtain a resin encapsulated semiconductor device having the quartz glass powder and CTBN rubber-like particles dispersed in the resin layer. The particle size of the rubber-like particles in the composition ranged from 2 to 10 μm.

In the samme composite acceleration test as in Example 1, this device stood 50 cycles of the test.

COMPARATIVE EXAMPLE 1

The following ingredients (1)–(4) were stirred and mixed uniformly.

| | | |
|---|---|---|
| (1) | Bisphenol A type epoxy compound (epoxy equivalent: 192) | 100 parts |
| (2) | MHAC-P | 80 parts |
| (3) | γ-Glycidoxypropyltrimethoxysilane | 1 part |
| (4) | 2-Methyl-4-methylimidazole | 1 part |

This composition was coated on a 5 mm × 5 mm MOS type LSI element in the samme way as Example 1 and cured at 100° C. for 2 hours and at 150° C. for 5 hours to obtain a resin encapsulated semiconductor device with a single resin layer. When this device was subjected to the same composite acceleration test as in Example 1, three samples among five became defective at the 5th cycle of the test.

COMPARATIVE EXAMPLE 2

The following ingredients (1)–(5) were stirred and mixed uniformly.

| | | |
|---|---|---|
| (1) | Novolak type epoxy resin (epoxy equivalent: 175) | 100 parts |
| (2) | MHAC-P | 80 parts |
| (3) | Quartz glass powder (particle size: 50 μm or less, 50% by volume) | 405 parts |
| (4) | γ-Glycidoxypropyltrimethoxysilane | 3 parts |
| (5) | 2-Ethyl-4-methylimidazole | 1 part |

This composition was coated on a 5 mm × 5 mm MOS type LSI element in the same manner as Example 1 and cured at 100° C. for 2 hours and at 150° C. for 5 hours to obtain a resin encapsulated semiconductor device having quartz glass powder dispersed in the resin layer.

When these devices were subjected to the same composite acceleration test as in Example 1, two samples among ten became defective at the 30th cycle of the test.

To analyze the causes of defectiveness, the molding resin of the defective unit was decomposed with 200° C. hot concentrated sulfuric acid. Cracks were found in the protective $SiO_2$ film of the element surface.

Stress determination test

Development of stress when molded by using molding resins of Comparative Example 2 and Example 3 was measured by way of a model. The model was an iron-made cylinder (measuring 90 mm in outer diameter, 1.5 mm in thickness and 200 mm in height) having a strain gauge attached to the inside of the cylinder, the outside thereof being resin molded to a thickness of 20 mm. After molding, the stress built up in the circumferential direction was determined from the amount of deformation of the iron-made cylinder. As a result, the stress generated in the molding using the resin of Comparative Example 2 was as high as $1.05 \pm 0.15$ kg/mm$^2$, whereas that in the molding using the resin of Example 3 was as low as $0.40 \pm 0.15$ kg/mm$^2$.

It is well known that said stress measuring model gives a measured value well agreeing with the value calculated from the resin properties.

The calculated value of the stress can be determined in the following way.

Supposing that the inner radius of the iron-made cylinder is $R_1$, the outer radius thereof is $R_2$, the outer radius of the molding resin layer on the outside of the iron-made cylinder is $R_3$, the elastic modulus is E, the linear expansion coefficient is $\alpha$, the Poisson's ratio is $\nu$, then the maximum circumferential stress ($\nu_t$) is given as follows.

In the iron-made cylinder ($\sigma_{t\cdot Me}$) (Me: abbreviation of metal):

$$\sigma_{t\cdot Me} = \frac{-2R_2^2 P}{(R_2^2 - R_1^2)} \quad (1)$$

In the resin layer ($\sigma_{t\cdot Re}$) (Re: abbreviation of resin):

$$\sigma_{t\cdot Re} = \frac{(R_2^2 + R_3^2)P}{(R_3^2 - R_2^2)} \quad (2)$$

Then, P can be represented by the following formula:

$$P = \frac{(\alpha_{Re} - \alpha_{Me}) \cdot (T_{cure} - T_{room})}{\dfrac{\dfrac{R_2^2 + R_3^2}{R_3^2 - R_2^2} + \nu_{RE}}{E_{Re}} + \dfrac{\dfrac{R_1^2 + R_2^2}{R_2^2 - R_1^2} - \nu_{Me}}{E_{Me}}} \quad (3)$$

wherein $T_{cure}$ is curing temperature and $T_{room}$ is room temperature. (See Takeuchi and Fukushi: The Institute of Electrical Engineers of Japan, Research Group Data, Insulating Material Research Group Report EIM-79-51 (1979)).

When the stress was calculated from the above-shown equations (1) and (3) by using the property values of each resin shown in Table 1, there were obtained the values also shown in Table 1. In the case of Comparative Example 2, the calculated value almost agreed with the measured value, but in the case of Example 3 the measured value was far smaller than the calculated value. This indicates that the actually produced stress reducing effect is far greater than that expected from the reduction of the elastic modulus.

TABLE 1

|  | Example 3 | Comparative Example 2 | Iron |
|---|---|---|---|
| Linear expansion coefficient ($\alpha$) (Deg$^{-1}$) | $2.3 \times 10^{-5}$ | $2.2 \times 10^{-5}$ | $1.1 \times 10^{-5}$ |
| Poisson's ratio ($\nu$) | 0.27 | 0.27 | 0.35 |
| Modulus of elasticity (E) (at 20° C.) Kg/mm$^2$ | 980 | 1200 | 21000 |
| Glass transition temperature (°C.) | 165 | 165 | — |
| Stress $\sigma_{t\cdot Re}$ (calculated) (Kg/mm$^2$) | 1.08 | 1.14 | — |
| Stress $\sigma_{t\cdot Re}$ (measured) (Kg/mm$^2$) | 0.4 ± 0.15 | 1.05 ± 0.15 | — |

EXAMPLES 4-8 AND COMPARATIVE EXAMPLE 3

The materials with the mixing ratios shown in Table 2 were roll milled under the conditions of 80° C. and 7 minutes to obtain the transfer molding compositions and then these molding powders were subjected to (A) determination of Young's modulus after curing and molding of each molding composition, (B) the heat cycle test and (C) a clamping test measuring stress (measuring test).

The molding conditions were 180° C. and 3 minutes, and the molding operation was followed by post curing at 150° C. for 15 hours. The heat cycle test was conducted on the MOS type IC elements of FIG. 3 (10 specimens for each group) made from each said molding composition under the same conditions as in the composite acceleration test of Example 1. The clamping stress measuring test was conducted by using a steel-made cylinder having an outer diameter of 10 mm and a thickness of 0.3 mm, with the inner diameter of the outer mold being 50 mm, under the same conditions as in the aforesaid stress determination test.

There were also molded the compositions to which no quartz glass powder was added, and their sections were observed through electron microscope photographs. The rubber particles in the cured resin had a particle size ranging from 2 to 4 μm.

TABLE 2

|  | Comparative Example 3 | Example 4 | Example 5 | Example 6 | Example 7 | Example 8 |
|---|---|---|---|---|---|---|
| Composition (parts) | | | | | | |
| Cresol-novolak type epoxy resin (epoxy equivalent: 225) | 68 | 65 | 62 | 55 | 49 | 43 |
| Phenol novolak resin | 32 | 30 | 28 | 25 | 21 | 17 |
| CTBN1300 × 13* | 0 | 5 | 10 | 20 | 30 | 40 |
|  | (0 vol %) | (2.7 vol %) | (5.3 vol %) | (10.6 vol %) | (15.7 vol %) | (20.8 vol %) |
| 2-Phenylimidazole | 0.6 | 0.6 | 0.6 | 0.6 | 0.6 | 0.6 |
| γ-Glycidoxypropyl-trimethoxysilane | 1.5 | 1.5 | 1.5 | 1.5 | 1.5 | 1.5 |
| Quartz glass powder (150 μm or less in particle size) | 225 | 225 | 225 | 225 | 225 | 225 |
|  | (55 vol %) | (55 vol %) | (55 vol %) | (54 vol %) | (54 vol %) | (53 vol %) |
| Properties | | | | | | |
| Young's modulus at room temp. (Kg/mm$^2$) | 1500 | 1350 | 1200 | 900 | 600 | 250 |
| Heat cycle fraction defective after 50 cycles | 8/10 | 1/10 | 0/10 | 0/10 | 0/10 | 0/10 |
| Stress $\sigma_{t\cdot Re}$ (Kg/mm$^2$) | | | | | | |
| Calculated | 0.79 | 0.73 | 0.69 | 0.55 | 0.49 | 0.26 |

TABLE 2-continued

|  | Comparative Example 3 | Example 4 | Example 5 | Example 6 | Example 7 | Example 8 |
|---|---|---|---|---|---|---|
| Measured | 0.9 ± 0.2 | 0.5 ± 0.15 | 0.3 ± 0.1 | 0.2 ± 0.1 | 0.2 ± 0.1 | 0.1 ± 0.1 |

(Note)
*Carboxy terminated butadiene-acrylonitrile copolymer produced by B. F. Goodrich Co.

EXAMPLE 9

MOS type LSI elements were prepared in the same manner as Example 2 except that no allylphenol (4) was used and that the rubber particle size was adjusted to 300–700 μm, and these elements were subjected to the same heat cycle test as in Example 1. As a result, two out of 10 elements tested produced cracks in the encapsulating resin in 40–50 cycles. Their inferiority to the product of Example 2 is considered due to the very large size (about 0.3–0.7 mm) of the rubber particles.

| Example 10 | | |
|---|---|---|
| (1) | Novolak type epoxy resin (epoxy equivalent: 175) | 50 parts |
| (2) | Diglycidyl ester of linoleic acid dimer (epoxy equivalent: 430, EP-871 by Shell Chemical Co.) | 50 parts |
| (3) | Liquid modified diphenylmethane diisocyanate (Desmodur CD by Bayer A.G.) | 140 parts |
| (4) | γ-Glycidoxypropyltrimethoxysilane | 5 parts |
| (5) | Quartz glass powder (55 vol %) | 550 parts |
| (6) | 1-Cyanoethyl-2-ethyl-4-methylimidazole | 2 parts |

The above ingredients (1) to (5) were mixed in a vacuum mixing and grinding machine for 20 minutes, and after addign another ingredient (6), they were further mixed up for 5 minutes. Then the composition was potted into a 5 mm×5 mm MOS type LSI silicone element shown in FIG. 1 in the same manner as Example 1 and then cured at 80° C. for 15 hours and at 180° C. for additional 15 hours to obtain a resin encapsulated semiconductor device. The rubber particles had a particle size of 2–5 μm and the rubber content was approximately 12% by volume.

When this device was subjected to the same accelerated heat cycle test as in Example 1, it could endure 50 cycles.

| Example 11 | | |
|---|---|---|
| (1) | Cresol novolak type epoxy resin (epoxy equivalent: 225) | 66 parts |
| (2) | Phenol novolak resin | 31 parts |
| (3) | CTBN 1300 × 13 (1.5 vol %) | 3 parts |
| (4) | 2-Phenylimidazole | 0.6 part |
| (5) | γ-Glycidoxypropyltrimethoxysilane | 1.5 parts |
| (6) | Quartz glass powder (150 μm or less in particle size, 55 vol %) | 225 parts |

The above-said ingredients (1) to (6) were mixed in the same manner as Example 4 to prepare a molding composition. The rubber particles were 2–4 μm in size. Then the obtained molding powder was subjected to (A) determination of Young's modulus, (B) the heat cycle test and (C) the clamping stress measuring test after the manner of Example 4. The results were as follows:

| | |
|---|---|
| Young's modulus at room temperature | 1420 Kg/mm² |
| Heat cycle fraction defective (after 50 cycles) | 1/10 |
| Stress $\sigma_{t\text{-}Re}$ | |
| Calculated: 0.75 Kg/mm² | |
| Measured: 0.55 ± 0.15 Kg/mm² | |

As described hereinabove, according to the present invention which features dispersion of the specific rubber-like particles in the encapsulating resin layer, there are provided the high-reliability resin encapsulated electronic devices such as electronic elements which are minimized in thermal stress and which can stay free of cracks in long-time use.

What is claimed is:

1. A resin encapsulated electronic device having at least one flat-shaped integrated circuit element wherein the maximum lateral length of the element is four times or more as large as the thickness, said element having a passivation film formed thereon, and cured resin composition encapsulating said integrated circuit element; said cured resin composition containing a matrix resin and rubber particles uniformly dispersed therein and being an encapsulating material for said integrated circuit element; the rubber particles having rubber elasticity and being formed from a rubber-like material reactive with the matrix resin; said cured resin composition further comprising 80% by volume or less of an inorganic filler.

2. A resin encapsulated electronic device according to claim 1, wherein said rubber particle content in said cured resin composition is 70 to 1.5% by volume.

3. A resin encapsulated electronic device according to claim 1, wherein the content of said rubber particles in the cured resin composition is 50 to 1.5% by volume when the rubber particles are formed from an aqueous latex or uncured liquid rubber.

4. A resin encapsulated electronic device according to claim 1, wherein said rubber particles have an average particle size of 150 μm or less.

5. A resin encapsulated electronic device according to claim 1, wherein said inorganic filler has a particle size of not greater than 200 μm.

6. A resin encapsulated electronic device according to claim 5, wherein the content of the rubber particles in the cured resin composition is 70 to 1.5% by volume and the content of the inorganic filler in the cured resin composition is not greater than 80% by volume.

7. A resin encapsulated electronic device according to claim 1, wherein said matrix resin is a silicone modified epoxy resin.

8. A resin encapsulated electronic device comprising outer leads, an integrated circuit element having a p-n junction; and internal fine connector wires which connect the integrated circuit element with the outer leads; at least the integrated circuit element, the connector wires and connection portions between said wires and said outer leads being encapsulated with a cured resin composition containing a matrix resin and rubber particles uniformly dispersed therein; said cured resin composition being an encapsulating material for said device; the rubber particles having rubber elasticity and being formed from a rubber-like material reactive with the matrix resin and the cured resin composition further comprising 80% by volume or less of an inorganic filler.

9. A resin encapsulated electronic device comprising copper foils as outer leads; an integrated circuit element having a p-n junction and metal balls or solder connecting the integrated circuit element with individual copper foils; at least the integrated circuit element, the metal balls or the solder and connection portions between the metal balls or the solder and the copper foils being encapsulated with a cured resin composition containing a matrix resin and rubber particles uniformly dispersed therein; said cured resin composition being an encapsulating material for said device, the rubber particles having rubber elasticity and being formed from a rubber-like material reactive with the matrix resin and the cured resin composition further comprising 80% by volume or less of an inorganic filler.

10. A resin encapsulated semiconductor device comprising a semiconductor element having p-n junctions formed on a portion of the major surface thereof and a cured resin composition containing a matrix resin of a silicon modified epoxy resin and rubber-like particles uniformly dispersed therein and encapsulating said semiconductor element, said rubber-like particles having a particle size of 30 $\mu$m or less and having an elastic modulus of 30 kg/mm$^2$ or less at room temperature, said rubber-like particles being formed from rubber-like material having one or more functional groups that are reactive with the matrix resin; the content of said rubber-like particles in the cured resin composition being not more than 70% by volume; said cured resin composition further comprising 80% by volume or less of an inorganic filler.

11. A resin encapsulated semiconductor device according to claim 10, wherein the rubber-like material is at least one member selected from the group consisting of polybutadiene-or butadiene-based copolymers, isoprene rubber, chloroprene rubber, polyurethane rubber, ethylene-propylene rubber, silicone rubber, fluorine rubber, fluorosilicone rubber, polyester rubber, natural rubber and polyphosphazene rubber.

12. A resin encapsulated semiconductor device according to claim 10, wherein the resin composition contains 50 to 1% by volume of the rubber-like particles.

13. A resin encapsulated semiconductor device according to claim 10, wherein the rubber-like material is a silicone rubber.

14. A resin encapsulated semiconductor device comprising an integrated circuit element having a passivation film formed thereon and an angular shape in section in the thicknesswise direction and a cured resin composition containing a matrix resin of a silicon modified epoxy resin and rubber-like particles uniformly dispersed therein and encapsulating said integrated circuit element; said rubber-like particles being made of a silicone rubber and having a particle size of 30 $\mu$m or less and having an elastic modulus of 30 kg/mm$^2$ or less at room temperature, said rubber-like particles being formed from a silicone rubber material having one or more functional groups which are reactive with the matrix resin; the content of the said rubber-like particles in the cured resin composition being not more than 70% by volume; and the cured resin composition further comprising 80% by volume or less of an inorganic filler.

15. A resin encapsulated semiconductor device according to claim 14, wherein the resin composition contains 50 to 1% by volume of rubber-like particles.

16. In a semiconductor device in which a semiconductor chip is encapsulated directly or indirectly with a resin encapsulation of a cured resin composition, said semiconductor chip having at least one major surface whose area is much larger than that of a side surface thereof, said major surface being disposed with a necessary functioning element, the improvement wherein the thickness of said encapsulation in a direction perpendicular to said major surface of said semiconductor chip is not greater than 24 times the thickness of said semiconductor chip, and said cured resin composition contains a matrix resin and rubber-like particles uniformly dispersed therein; said rubber-like particles having a particle size of 30 $\mu$m or less and having an elastic modulus of 30 kg/mm$^2$ or less at room temperature, said rubber-like particles being formed from a rubber-like material having one or more functional groups reactive with the matrix resin; the content of said rubber-like particles in the cured resin composition being not more than 70% by volume and said resin composition further comprising 80% by volume or less of an inorganic filler.

17. A semiconductor device according to claim 16, wherein said major surface has a passivation film covering pn-junction surfaces, said passivation film having a thickness of not greater than 3$\mu$m.

18. A semiconductor device comprising a semiconductor element having a p-n junction formed on an electroconductive substrate which can be part of a lead, said semiconductor element being connected to one or more leads by one or more fine connector wires, said semiconductor element, said electroconductive substrate, said connector wires and a part of each lead being encapsulated with a cured resin composition containing a matrix resin and rubber-like particles uniformly dispersed therein, said rubber-like particles having a particle size of 30 $\mu$m or less and having an elastic modulus of 30 kg/mm$^2$ or less at room temperature, said rubber-like particles being made of a rubber-like material having one or more functional groups which are reactive with the matrix resin; the content of said rubber-like particles in the cured resin composition being not more than 70% by volume and said resin composition further comprising 80% by volume or less of an inorganic filler.

19. A resin encapsulate semiconductor device according to claim 18, wherein said functional groups are selected from the group consisting of a carboxyl group, an epoxy group, a hydroxyl group, an isocyanate group, an amino group and vinyl group.

20. A resin encapsulated semiconductor device according to claim 18, wherein said matrix resin is selected from the group consisting of an epoxy resin, a phenolic resin, an addition-type imide resin, a urethane resin, an epoxy isocyanate resin, and a diallyl phthalate resin.

21. A resin encapsulated integrated circuit device having at least one flat-shaped integrated circuit element wherein the maximum lateral length of the element is four times or more as large as the thickness, and a cured resin composition encapsulating said integrated circuit element; said cured resin composition containing a matrix resin and rubber particles uniformly dispersed therein and being an encapsulating material for said device; the rubber particles having rubber elasticity and being formed from a rubber-like material reactive with the matrix resin; said cured resin composition further comprising 80% by volume or less of an inorganic filler.

22. A resin encapsulated integrated circuit device according to claim 21, wherein the content of said rubber particles in said cured resin compostion is 70 to 1.5% by volume.

23. A resin encapsulated integrated circuit device according to 21, wherein the content of said rubber particles in said cured resin composition is 50 to 1.5% by volume when the rubber particles are formed from an aqueous latex or uncured liquid rubber.

24. A resin encapsulated integrated circuit device according to claim 21, wherein said rubber particles have an average particle size of 150 μm or less.

25. A resin encapsulated integrated circuit device according to claim 21, wherein said inorganic filler has a particle size of not greater than 200 μm.

26. A resin encapsulated integrated circuit device according to claim 25, wherein the content of the rubber particles in the cured resin composition is 70 to 1.5% by volume and the content of the inorganic filler in the cured resin composition is not greater than 80% by volume.

27. A resin encapsulated integrated circuit device according to claim 21, wherein said matrix resin is a silicone modified epoxy resin.

28. A resin encapsulated semiconductor device comprising electrical leads, an integrated circuit element having a p-n junction and internal fine connector wires which connect the integrated circuit element with the leads, at least the integrated circuit element, the connector wires and the leads being encapsulated with a cured resin composition containing a matrix resin and rubber particles uniformly dispersed therein; said cured resin composition being an encapsulating material for said device; the rubber particles having rubber elasticity and being formed from a rubber-like material reactive with the matrix resin and the cured resin composition further comprising 80% by volume or less of an inorganic filler.

29. A resin encapsulating semiconductor device comprising copper foils as electrical leads, an integrated circuit element having a p-n junction and metal balls or solder connecting the integrated circuit element with individual copper foils; at least the integrated circuit element, the metal balls or the solder and connection portions between the copper foils and the metal balls or the solder being encapsulated with a cured resin composition containing a matrix resin and rubber particles uniformly dispersed therein; the rubber particles having rubber elasticity and being formed from a rubber-like material reactive with the matrix resin and the cured resin composition further comprising 80% by volume or less of an inorganic filler.

30. A semiconductor device encapsulated by a cured resin composition; said cured resin composition comprising a matrix resin and rubber particles uniformly dispersed therein and being the encapsulating material for said semiconductor device; the rubber particles having rubber elasticity and being formed of a rubber-like material reactive with the matrix resin during curing; said cured resin composition further comprising 80% by volume or less of an inorganic filler.

* * * * *